US006603271B2

(12) United States Patent
Noh

(10) Patent No.: US 6,603,271 B2
(45) Date of Patent: Aug. 5, 2003

(54) ILLUMINATION LAMP HAVING BRIGHTNESS AND COLOR CONTROL

(75) Inventor: Shi-Youl Noh, Seoul (KR)

(73) Assignee: Boam R & D Co., Ltd., Kyonggi-Do (KR)

( * ) Notice: Subject to any disclaimer, the term of this patent is extended or adjusted under 35 U.S.C. 154(b) by 0 days.

(21) Appl. No.: 09/969,614

(22) Filed: Oct. 4, 2001

(65) Prior Publication Data

US 2002/0047647 A1 Apr. 25, 2002

Related U.S. Application Data

(63) Continuation-in-part of application No. 09/371,043, filed on Aug. 10, 1999, which is a continuation-in-part of application No. 09/243,470, filed on Feb. 3, 1999, now abandoned.

(51) Int. Cl.[7] .......................... H05B 37/00; H01L 27/14

(52) U.S. Cl. ............................... 315/185 S; 315/200 R; 315/312; 315/324; 315/DIG. 4; 362/800; 362/806

(58) Field of Search ............................ 315/185 S, 312, 315/324, 291, 200 R, DIG. 4; 362/800, 802, 806, 812

(56) References Cited

U.S. PATENT DOCUMENTS 4,625,152 A 11/1986 Nakai ......................... 315/317
4,653,925 A * 3/1987 Thornton, Jr. .............. 356/419
5,126,636 A 6/1992 Masaki ....................... 315/291
5,350,977 A 9/1994 Hamamoto et al. ......... 315/291
5,384,519 A 1/1995 Gotoh ........................ 315/324
5,418,432 A 5/1995 Takeuchi et al. ............ 315/151
5,583,484 A * 12/1996 Asano ........................ 340/461
5,748,171 A 5/1998 Ishizaki et al. ............. 345/101
5,967,892 A * 10/1999 Shoemaker, Jr. ............... 463/7
6,081,254 A 6/2000 Tanaka et al. .............. 345/154

* cited by examiner

*Primary Examiner*—Don Wong
(74) *Attorney, Agent, or Firm*—Fleshner & Kim, LLP

(57) ABSTRACT

An illumination lamp is provided which allows a user to perform brightness and color control in accordance with the state and purpose of use, the environment of use, or the tastes of the users, etc. The illumination lamp may include a rectifier configured to rectify a current supplied by a power supply; a ballast portion configured to start the lamp using the power rectified in the rectifier; a lamp portion that is connected to the ballast portion and that includes two or more tubes, each tube outputting light of a different color temperature; and a controller that is connected to the ballast portion, configured to control a brightness and color of light produced by the illumination lamp.

26 Claims, 4 Drawing Sheets

ILLUMINATION LAMP HAVING BRIGHTNESS AND COLOR CONTROL

This application is a Continuation-In-Part of prior Application No: 09/371,043 filed Aug. 10, 1999, which was a Continuation-In-Part of parent Application No. 09/243,470 filed Feb. 3, 1999, which is now abandoned.

BACKGROUND OF THE INVENTION

1. Field of the Invention

The invention relates to an illumination lamp which allows a user to perform a variety of brightness and color controls in accordance with the tastes of the users, or a state of use.

2. Background of the Related Art

A conventional illumination lamp generally outputs a single color of light, with a specified brightness.

Recently, there has been a growing tendency to use three lamps that output different wavelengths of light to provide a more natural light projection. However, it is impossible to control the brightness or red (R), green (G), and blue (B) colors of the recently developed three-wavelength lamps in accordance with the place of use or tastes of users.

Although every person has different taste, the optimal brightness of a lamp is approximately 4000K in the morning, 6000K in the afternoon, and 3000K in the evening. Unfortunately, the brightness and color of conventional illumination lamps are not controlled automatically or manually.

SUMMARY OF THE INVENTION

An object of the invention is to solve at least the above problems and/or disadvantages and to provide at least the advantages described hereinafter.

Accordingly, the invention is directed to an illumination lamp having brightness and color controls that substantially obviates at least one or more of the limitations and disadvantages of the related art.

An object of the invention is to provide an illumination lamp for performing optional brightness and color control according to the state and purpose of use or the environment of use and the tastes of users.

Additional features and advantages of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

To achieve these and other advantages, and in accordance with the purpose of the invention as embodied and broadly described, the illumination lamp includes: a rectifier that rectifies a current supplied by a power supply; a ballast portion that lights up the illumination lamp using the power rectified in the rectifier; a lamp that is connected to the ballast portion and that may comprise at least two light generating devices, each light generating device outputting light of a different color temperature; and a controller that is connected to the ballast portion, and that controls a brightness and color of light output by the lamp.

The controller may be connected to a display unit comprising a display panel of light emitting diodes (LEDs), or to a control stick. The controller is used to control the brightness and/or color temperature of the light output by the device in accordance with an operating state, the operating environment, or the tastes of the user.

It is to be understood that both the foregoing general description and the following detailed description are exemplary and explanatory and are intended to provide further explanation of the invention as claimed.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF PREFERRED EMBODIMENTS

Reference will now be made in detail to the preferred embodiments of the invention, examples of which are illustrated in the accompanying drawings.

Figure 1:
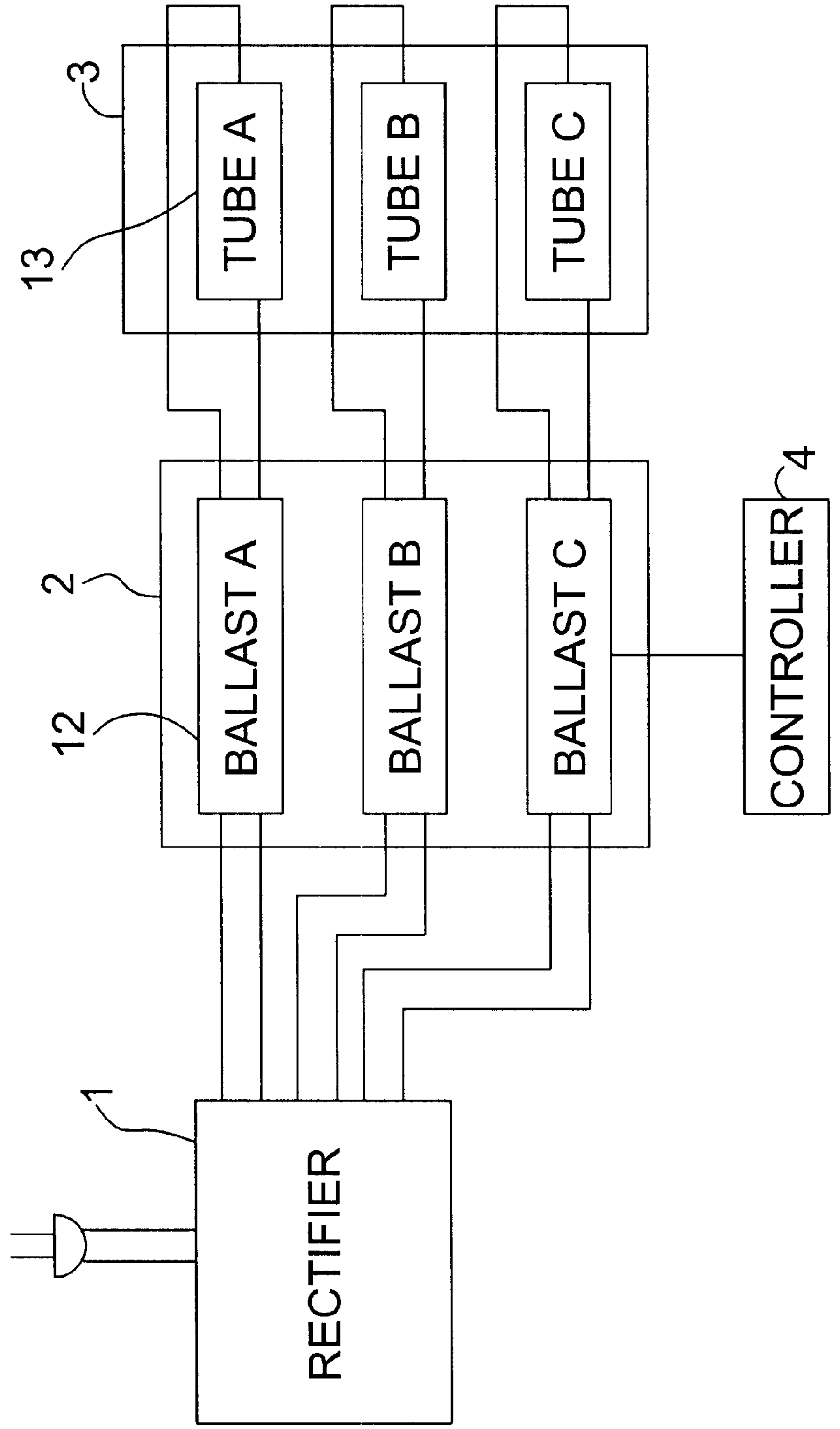
FIG. 1 is a schematic block diagram of an illumination lamp according to the invention.

FIG. 1 schematically shows the structure of an illumination lamp in accordance with an embodiment of the invention. The illumination lamp includes a rectifier 1 that performs power supply rectification, a ballast portion 2, and a lamp 3 that provides illumination. In this embodiment of the invention, the lamp 3 is comprised of at least two gas discharge tubes 13, each outputting light of a different color temperature. In one preferred embodiment, the lamp 3 comprises three gas discharge tubes, each outputting light at a different color temperature. The resulting light output from lamp 3 is the combination of light output by the three gas discharge tubes at the different color temperatures, which, in one preferred embodiment, is similar respectively to light output by red (R), green (G), and the blue (B) incandescent light sources. However, it should be understood that the lamp could be composed of only two gas discharge tubes, or more than three gas discharge tubes based on the application, environment of use, desires of the user, etc.

Color temperature is a different concept then simply color. The concept of "color temperature" refers to a black body source that is heated to a sufficiently high temperature that it begins to glow, and thus outputs visible light. A particular "color temperature" is a reference to the light output by the black body when it is heated to a specified temperature.

Light at any given "color temperature" will include light in substantially all wavelengths across the entire spectrum of visible light. Light at lower color temperatures will have greater power in the longer wavelengths of light than in the smaller wavelengths of light. Conversely, light having a high color temperature will have greater power in the smaller wavelength range than in the larger wavelength range. The light at each "color temperature," however, includes light at substantially all wavelengths in the visible range. This is in contrast to light of a particular "color" where all of the wavelengths are concentrated in a portion of the visible range. There will be a fairly smooth transition in the power at different wavelengths as one passes across the visible spectrum.

In contrast, a traditional colored lamp, such as a conventional fluorescent tube only, outputs light in relatively narrow bands of visible wavelengths. With a traditional "colored" lamp, substantially no light is output at wavelengths outside specific, narrow, color bands. Similarly, other conventional lamps combine a light source with a filter. Hence, the lamps using such a design have a sharp transition in output power between the wavelengths within the desired color band and the wavelengths outside the desired color band.

The gas discharged tubes according to the invention are designed to output light having a particular "color temperature," as opposed to a particular "color." This means that each gas discharge tube outputs light in substantially all wavelengths across the entire visible spectrum, not in just a narrow band of wavelengths. In a preferred embodiment of the invention, this is accomplished by mixing together a variety of different fluorescent substances which are then used to manufacture the fluorescent tubes. It should be noted that any light source capable of outputting substantially all wavelengths across the visible spectrum outputs light having a color temperature.

As shown in FIG. 1, ballasts 12 connected to the respective tubes 13, are also connected to a controller 4 for controlling the ballasts 12. As a result, all the ballasts 12 can be controlled separate from one another, and they are operated automatically within a predetermined scope, or manually. For instance, in the case of a general desk lamp embodying the invention, in addition to the basic on/off operation, the controller 4 is operated to control the color and/or brightness of the light output by the lamp, depending on the environment of study, i.e., the ambient brightness, the structure of a room, the amount of sunlight, etc.

That is, the color and/or brightness of the lamp is controlled by varying the intensity of the light output by the individual gas discharge tubes. The intensity of each of the gas discharge tubes is individually controlled by the controller via each gas discharge tube's respective ballast, which varies the amount of current flowing through the respective gas discharge tube. In one embodiment of the invention, the gas discharge tubes each outputs light of a different color temperature but with substantially all wavelengths in the visible spectrum. This makes it possible for the lamp to provide a wide range of color and/or brightness combination from which a user may select. Further, the combined light of the gas discharge tubes output by the lamp is sufficiently mixed in comparison to conventional lamps so that the output light appears as a single color, the color selected by the user. This is because each of the individual lamps output a different color temperature of light that includes light in substantially all wavelengths across the entire visible spectrum. Hence, varying the brightness of each of the different color temperature lamps essentially varies the power in substantially all wavelengths in the visible spectrum. Since the other color temperature lamps also have power over substantially all wavelengths in the visible spectrum, the resulting change in the color temperature of the combined light is smoother. In addition, by varying the brightness of each of the different color temperature lamps, one can vary the color temperature of the combined output light.

Figure 2:
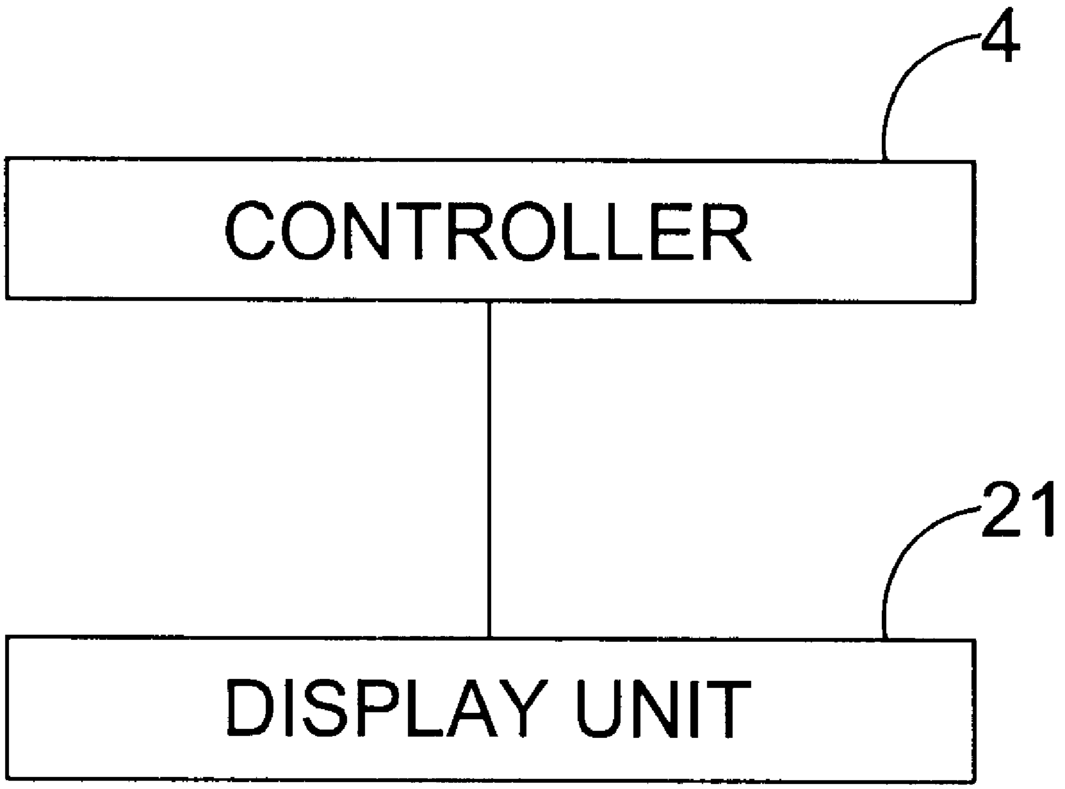
FIG. 2 is a partial block diagram of another embodiment according to the invention.

FIG. 2 shows another embodiment of the present invention where a display unit 21, for indicating the brightness and color temperature settings, is connected to the controller 4. The display unit 21 helps a user to freely control the brightness and color temperature when necessary.

Figure 3:
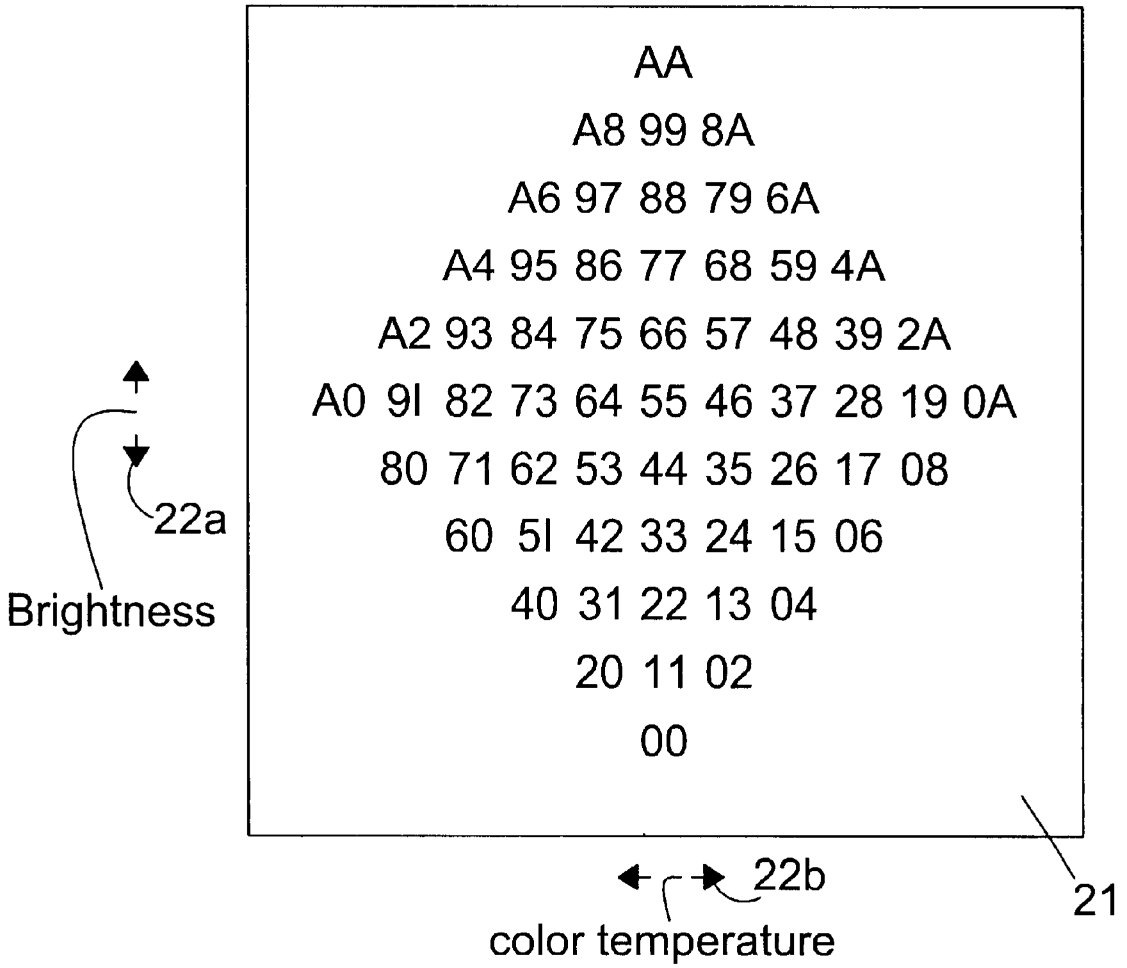
FIG. 3 is a schematic diagram of the display unit depicted in FIG. 2.

A display unit 21 which can be incorporated in a device embodying the invention is shown in FIG. 3. The display comprises a plurality of light emitting diodes (LEDs) arranged in a diamond shaped pattern. The LEDs are selectively illuminated to indicate the brightness and color settings.

As shown in FIG. 3, the x-axis of the display indicates the color temperature, and the y-axis of the display indicates the brightness. The control of color temperature and brightness is established based upon predetermined values of the color temperature and brightness on the x and y axes. The display unit 21 allows a user to select a certain state and to recognize degrees of color temperature and brightness corresponding to the selected state through the illumination of the LEDs in the display 21.

The user can control the brightness and color temperature of a lamp, depending on the circumstances, by operating brightness control switches **22*a* and color temperature control switches 22*b*,** which may be provided on sides of the display. The user can adjust the brightness and color temperature to desired values based upon the predetermined values.

The display unit 21 may be located in the illumination lamp. The control switches **22*a* and 22*b*** can be embodied in different forms according to a variety of known types, such as slide type and button type.

Figure 4:
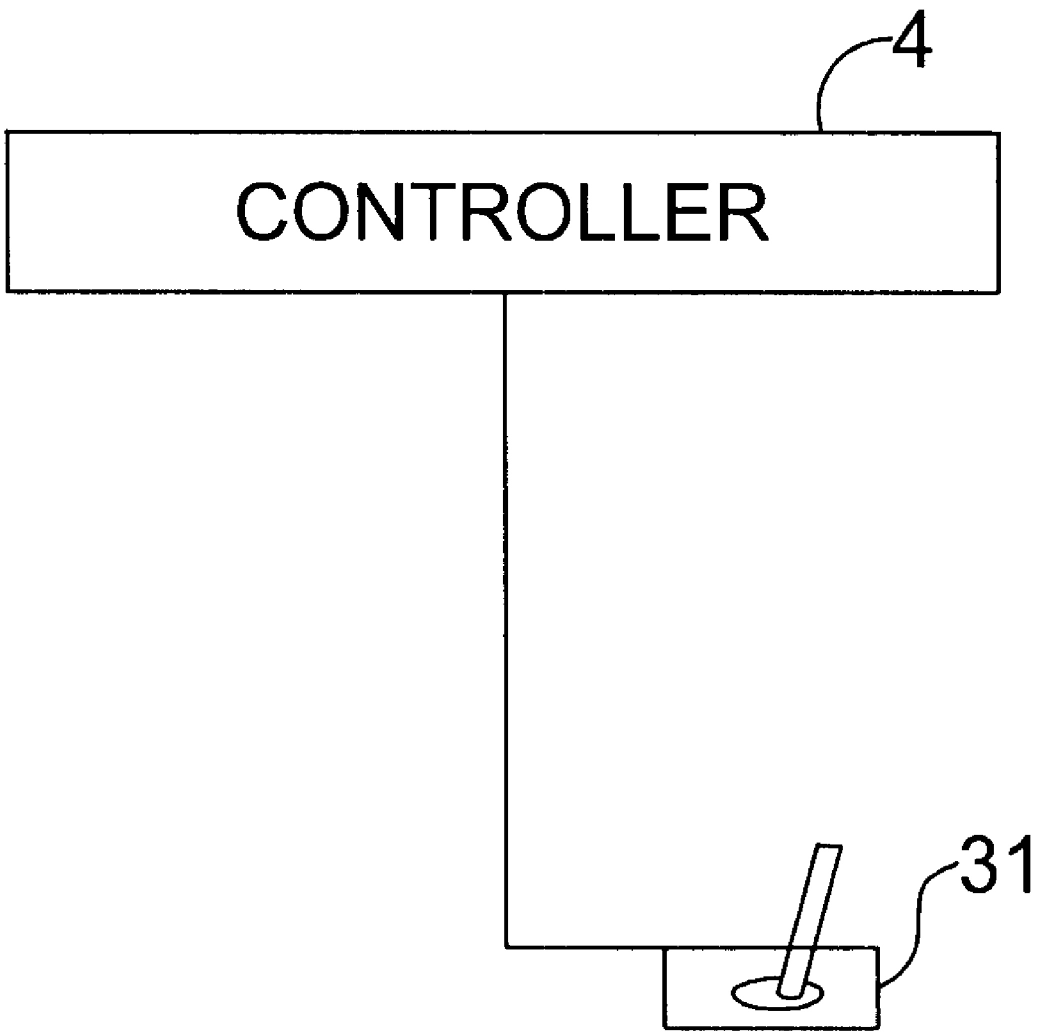
FIG. 4 is a partial block diagram of another embodiment of according to the invention.

In an alternate embodiment of the invention, instead of using control switches and a display, as shown in FIG. 3, a control stick 21 (e.g., in the form of a joy stick), may be connected to the controller 4, as shown in FIG. 4. The control stick 31 would be used to properly control the color temperature and brightness through positioning of the control stick 31. The physical location of the control stick 31 would give an indication of the brightness and color settings. This embodiment may also include a display, which would give an indication to the user of the brightness and color settings.

A lamp according to the invention provides optimum illumination by controlling, over a wide range, the color and intensity of light output by individual gas discharge tubes and thereby the light output by the lamp, according to the purpose for which the lamp is used. For instance, different colors and intensity values could be used for a desk lamp, an illumination apparatus, a display lamp, etc.

To obtain different color representations, gas discharge tubes, which respectively output light at a color temperature having an appearance similar to red, green and blue incandescent light color, are used together. Two or more tubes each having a different shape or outputting light at different color temperatures may be associated with each other, or the tubes are associated with one another have more subdivided colors.

As described above, illumination lamps according to the invention may include more than two gas discharge tubes, each outputting light having a different color temperature. The different tubes are associated with one another, and are controlled automatically or manually, so that a variety of color and brightness controls is achieved in accordance with the purpose or environment of use.

It will be apparent to those skilled in the art that various modifications and variations can be made in the illumination lamp having the brightness and color control according to the invention without deviating from the spirit or scope of the invention. Thus, it is intended that the invention cover the modifications and variations of this invention provided they come within the scope of the appended claims and their equivalents.

For instance, although the embodiments described above utilize gas discharge tubes to respectively produce light having different color temperatures, any type of light generating devices that are capable of outputting light of a specific color temperature could be used in the lamp according to the invention. Further, an embodiment might use fluorescent or electro-luminescent lighting devices, or devices that utilize microwaves to excite a gas in a tube. Any lighting devices that are capable of outputting light at a specific color temperature could be used. In the claims, means-plus-function clauses are intended to cover the structures described herein as performing the recited function and not only structural equivalents but also equivalent structures. For example, although a gas discharge tube and an incandescent light bulb may not be structural equivalents in that a gas discharge tube excites a gas to produce light, whereas an incandescent light bulb employs a heated filament, in the environment of providing light, a gas discharge tube and an incandescent light bulb may be equivalent structures.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. An illumination lamp, comprising:

a rectifier configured to rectify a current supplied by a power supply;

a ballast portion configured to start the illumination lamp using power rectified in the rectifier;

a lamp portion that is connected to the ballast portion and that comprises at least two light generating tubes, each light generating tube outputting light of a different color temperature; and a controller that is connected to the ballast portion, wherein the controller is configured to control a brightness and color of light generated by the illumination lamp.

2. The illumination lamp as claimed in claim 1, wherein at least one of said at least two light generating tubes comprises a gas discharge tube comprising a plurality of different fluorescent substances.

3. The illumination lamp of claim 1, wherein the controller is connected to a control stick that is movable in at least two substantially perpendicular directions, and wherein the control stick is configured to control a brightness and color temperature of light generated by the illumination lamp.

4. The illumination lamp of claim 3, wherein a position of the control stick indicates the brightness and color temperature settings of the illumination lamp.

5. The illumination lamp of claim 1, wherein each light generating tube outputs light of a different, non-variable color temperature.

6. An illumination lamp, comprising:

a rectifier configured to rectify a current supplied by a power supply;

a ballast portion configured to start the illumination lamp using power rectified in the rectifier;

a lamp portion that is connected to the ballast portion and that comprises at least two light generating tubes, each light generating tube outputting light of a different color temperature; and a controller that is connected to the ballast portion, wherein the controller is configured to control a brightness and color of light generated by the illumination lamp, wherein said controller comprises:

a display unit with a color temperature control axis and a brightness control axis that are substantially perpendicular to each other, wherein the display unit indicates the brightness and color temperature settings of the lamp; and at least one control switch configured to control a brightness and color temperature of light generated by the illumination lamp.

7. The illumination lamp of claim 6, wherein the at least one control switch includes a first switch configured to control a brightness of light generated by the illumination lamp and a second switch configured to control a color temperature of light generated by the illumination lamp.

8. The illumination lamp of claim 6, wherein the display unit includes a plurality of light emitting diodes that are selectively illuminated to indicate the brightness and color temperature settings of the lamp.

9. An illumination lamp, comprising:

a plurality of illumination devices, wherein each illumination device is configured to produce light of a different color temperature; and a controller that is configured to allow a user to control a brightness and a color temperature of light generated by the illumination lamp, and wherein the controller is also configured to indicate the brightness and color temperature settings of the illumination lamp.

10. The illumination lamp of claim 9, wherein the controller comprises a display device that indicates the brightness and color temperature settings of the illumination lamp.

11. The illumination lamp as claimed in claim 9, wherein at least one of said plurality of illumination devices comprises a gas discharge tube comprising a plurality of different fluorescent substances.

12. The illumination lamp of claim 9, wherein each illumination device is configured to produce light of a different, non-variable color temperature.

13. The illumination lamp of claim 9, wherein the controller comprises a joystick that is movable in first and second substantially perpendicular directions, wherein movement of the joystick in the first direction controls the brightness setting of the illumination lamp and wherein movement of the joystick in the second direction controls the color temperature setting of the illumination lamp.

14. The illumination lamp of claim 13, wherein the position of the joystick is indicative of both the brightness and color temperature settings of the illumination lamp.

15. The illumination lamp of claim 9, wherein the plurality of illumination devices comprise a plurality of gas discharge tubes, and wherein each of the gas discharge tubes is configured to output light having different wavelength characteristics.

16. The illumination lamp of claim 15, further comprising a ballast unit configured to control each of the plurality of gas discharge tubes, wherein the controller is connected to and controls the ballast unit.

17. An illumination lamp, comprising:

a plurality of illumination devices, wherein each illumination device is configured to produce light of a different color temperature; and a controller that is configured to allow a user to control a brightness and a color temperature of light generated by the illumination lamp, and wherein the controller is also configured to indicate the brightness and color temperature settings of the illumination lamp, wherein the controller comprises a display device that indicates the brightness and color temperature settings of the illumination lamp, and wherein the display device includes a plurality of light emitting diodes arranged in a two dimensional pattern on the display device.

18. The illumination lamp of claim 17, wherein the illumination status of the plurality of light emitting diodes indicates the brightness and color temperature settings of the illumination lamp.

19. The illumination lamp of claim 17, wherein the two dimensional pattern has a first axis that is indicative of the brightness setting of the illumination lamp and a second axis that is indicative of the color temperature setting of the illumination lamp.

20. An illumination lamp, comprising:

a plurality of means for producing light, wherein each of the plurality of light producing means is configured to generate light of a different color temperature, and wherein the plurality of light producing means are configured so that a brightness and a color temperature of the combined light output by all of the plurality of light producing means may be selectively varied;

means for controlling the brightness and the color temperature of the combined light generated by all of the plurality of light producing means based on a user input; and means for displaying the brightness and temperature settings.

21. The illumination lamp of claim 20, wherein the light producing means comprises a plurality of means for producing light, and wherein each of the plurality of light producing means is configured to generate light of a different color temperature.

22. The illumination lamp of claim 20, wherein the controlling means comprises:

means for controlling the brightness of the combined light generated by all of the plurality of light producing means; and means for controlling the color temperature of the combined light generated by all of the plurality of light producing means.

23. The illumination lamp of claim 20, wherein the controlling means includes a control lever, and wherein the position of the control lever indicates brightness and color temperature settings.

24. The illumination lamp as claimed in claim 20, wherein at least one of said plurality of means for producing light comprises a gas discharge tube comprising a plurality of different fluorescent substances.

25. The illumination lamp of claim 20, wherein each of the plurality of light producing means is configured to generate light of a different, non-variable color temperature.

26. An illumination lamp, comprising:

a plurality of means for producing light, wherein each of the plurality of light producing means is configured to generate light of a different color temperature, and wherein the plurality of light producing means are configured so that a brightness and a color temperature of the combined light output by all of the plurality of light producing means may be selectively varied;

means for controlling the brightness and the color temperature of the combined light generated by all of the plurality of light producing means based on a user input; and means for displaying the brightness and temperature settings, wherein the displaying means includes a two dimensional display, and wherein a position of a marker on the two dimensional display indicates both a brightness and a color temperature setting of the illumination lamp.

* * * * *